United States Patent
Leonowich et al.

(10) Patent No.: US 7,176,743 B2
(45) Date of Patent: Feb. 13, 2007

(54) DRIVER CIRCUIT CAPABLE OF PROVIDING RISE AND FALL TRANSITIONS THAT STEP SMOOTHLY IN THE TRANSITION REGIONS

(75) Inventors: Robert H. Leonowich, Fleetwood, PA (US); Xiaohong Quan, San Diego, CA (US)

(73) Assignee: Agere Systems Inc., Allentown, PA (US)

( * ) Notice: Subject to any disclaimer, the term of this patent is extended or adjusted under 35 U.S.C. 154(b) by 50 days.

(21) Appl. No.: 11/083,816

(22) Filed: Mar. 18, 2005

(65) Prior Publication Data

US 2006/0208774 A1    Sep. 21, 2006

(51) Int. Cl.
H03K 17/56 (2006.01)
(52) U.S. Cl. ........................ 327/423; 327/424; 327/112
(58) Field of Classification Search ................ 327/112, 327/423, 424, 427, 494, 496, 576, 588
See application file for complete search history.

(56) References Cited

U.S. PATENT DOCUMENTS 5,332,954 A * 7/1994 Lankin ........................ 318/139
6,052,017 A * 4/2000 Pidutti et al. ................ 327/424
6,201,421 B1 * 3/2001 Takeuchi et al. ............. 327/110
6,586,973 B2 * 7/2003 Yokoyama et al. .......... 327/108
6,801,062 B2 * 10/2004 Okada .......................... 327/108
6,906,561 B2 * 6/2005 Yu et al. ...................... 327/112

* cited by examiner

Primary Examiner—Timothy P. Callahan
Assistant Examiner—Hai L. Nguyen

(57) ABSTRACT

A driver circuit that has a plurality of output elements that are switched on and off in staggered fashion by signals generated by first and second drive chains of a drive chain configuration. The first drive chain comprises "N" delay elements, each of which produces a time delay equal to $t_{DELAY}$ such that the total time delay produced by the first drive chain is equal to ($N \times t_{DELAY}$). The second drive chain comprises N+1 delay elements, "N" of which produce a time delay equal to $t_{DELAY}$ and one of which produces a time delay equal to $\frac{1}{2}(t_{DELAY})$. Therefore, the total time delay produced by the second drive chain is equal to (($N \times t_{DELAY}$)+($\frac{1}{2}t_{DELAY}$)). The use of the delay element in the second drive that produces the time delay equal to $\frac{1}{2}(t_{DELAY})$ results in smooth transitions in the transition regions where the driver circuit output signal transitions from high to low and from low to high. In addition, the use of this additional delay element reduces the complexity of the driver circuit as well as the amount of power required to operate the driver circuit.

12 Claims, 8 Drawing Sheets

DRIVER CIRCUIT CAPABLE OF PROVIDING RISE AND FALL TRANSITIONS THAT STEP SMOOTHLY IN THE TRANSITION REGIONS

TECHNICAL FIELD OF THE INVENTION

The invention relates to a driver circuit of an integrated circuit (IC). More particularly, the invention relates to a driver circuit that has a wide range of programmable rise and fall transition times and which has relatively smooth steps in the transition regions where the driver output signal transitions from high to low and from low to high.

BACKGROUND OF THE INVENTION

Typically, output driver circuits have several parallel output stages that are switched in a staggered fashion to provide programmable rise and fall times. FIG. 1 illustrates a graph of driver output voltage as a function of time for an ideal case of a low to high transition. The curve 10 has a completely smooth transition from −1 to +1 volts during the time period from approximately t=2 milliseconds (ms) to approximately t=8 ms. The smooth transition shown in FIG. 1 does not occur in the non-ideal case.

FIG. 2 illustrates a graph of driver output voltage as a function of time for a non-ideal case of a transition from low to high for a driver circuit that employs 3-stage staggered switching. In the non-ideal case represented by the graph shown in FIG. 2, three steps 21, 22 and 23 occur during the transition from −1 to +1 volts during the time period from approximately 4 ms to approximately 8 ms.

It is desirable to smooth the steps in the transition regions. One way to ensure that the steps in the transition region are smooth is to use a distributed resistor-capacitor (RC) circuit in the driver circuit to provide the desired rise and fall transition times in the driver output signal. However, distributed RC circuits have limited capabilities because they generally are not programmable.

Another way to smooth the steps in the transition regions is to increase the number of stages that are staggered in the driver circuit. Currently, attempts are being made to increase the range of rise and fall times that can be provided by driver circuits. In order to smooth the steps in the transition regions of driver circuits that have wider ranges of rise and fall times, an even greater number of staggered stages are needed. Of course, increasing the number of staggered stages increases the complexity of the driver circuit as well as the amount of area that is needed to implement the driver circuit in an IC and the amount of power that the driver circuit consumes.

A need exists for a driver circuit that is capable of providing a wide range of programmable rise and fall times with relatively smooth steps in the transition regions. A need also exists for a driver circuit that has such capabilities and that is capable of being implemented in an IC in a relatively small area with relatively low complexity.

SUMMARY OF THE INVENTION

The present invention provides a driver circuit and a method for driving output elements of a driver circuit. The driver circuit comprises at least first and second output elements, a first drive chain, and a second drive chain. Each of the output elements comprises at least N transistors connected in parallel, where N is a positive integer having a value equal to or greater than 1. The first drive chain is configured to generate output signals for controlling switching of the transistors of at least the first output element. The first drive chain comprises N delay elements cascaded to form a series of delay elements, each of which produces a time delay equal to $t_{DELAY}$. The entire cascaded series of delay elements of the first drive chain produces an aggregate time delay equal to at least $(N \times t_{DELAY})$. The second drive chain is configured to generate output signals for controlling switching of the transistors of at least the second output element. The second drive chain comprises N+1 delay elements cascaded to form a series of delay elements, N of which each produce a time delay equal to $t_{DELAY}$ and a first one of which produces a time delay equal to $\frac{1}{2}(t_{DELAY})$. The entire cascaded series of delay elements of the second drive chain produces an aggregate time delay equal to at least $((N \times t_{DELAY}) + (\frac{1}{2} t_{DELAY}))$.

The method of the invention in accordance with one embodiment comprises driving a first output element of the driver circuit with a first signal generated by a first drive chain comprising N delay elements cascaded in series, and driving a second output element of the driver circuit with a second signal generated by a second drive chain comprising N+delay elements cascaded in series. Each delay element of the first drive chain produces a time delay equal to $t_{DELAY}$. The entire cascaded series of delay elements of the first drive chain produces an aggregate time delay equal to at least $(N \times t_{DELAY})$. N of the delay elements of the second drive chain each produce a time delay equal to $t_{DELAY}$ and a first one of the delay elements of the second drive chain produces a time delay equal to $\frac{1}{2}(t_{DELAY})$. The entire cascaded series of delay elements of the second drive chain produces an aggregate time delay equal to at least $((N \times t_{DELAY}) + (\frac{1}{2} t_{DELAY}))$.

The use of the delay element in the second drive chain that produces a time delay equal to $\frac{1}{2}(t_{DELAY})$ results in smoother transitions in the transition regions where the output signal of the driver circuit transitions from low to high and from high to low. In addition, the use of this delay element enables the complexity of the driver circuit to be decreased.

These and other features and advantages of the invention will become apparent from the following description, drawings and claims.

DETAILED DESCRIPTION OF THE PREFERRED EMBODIMENT

Figure 3A:
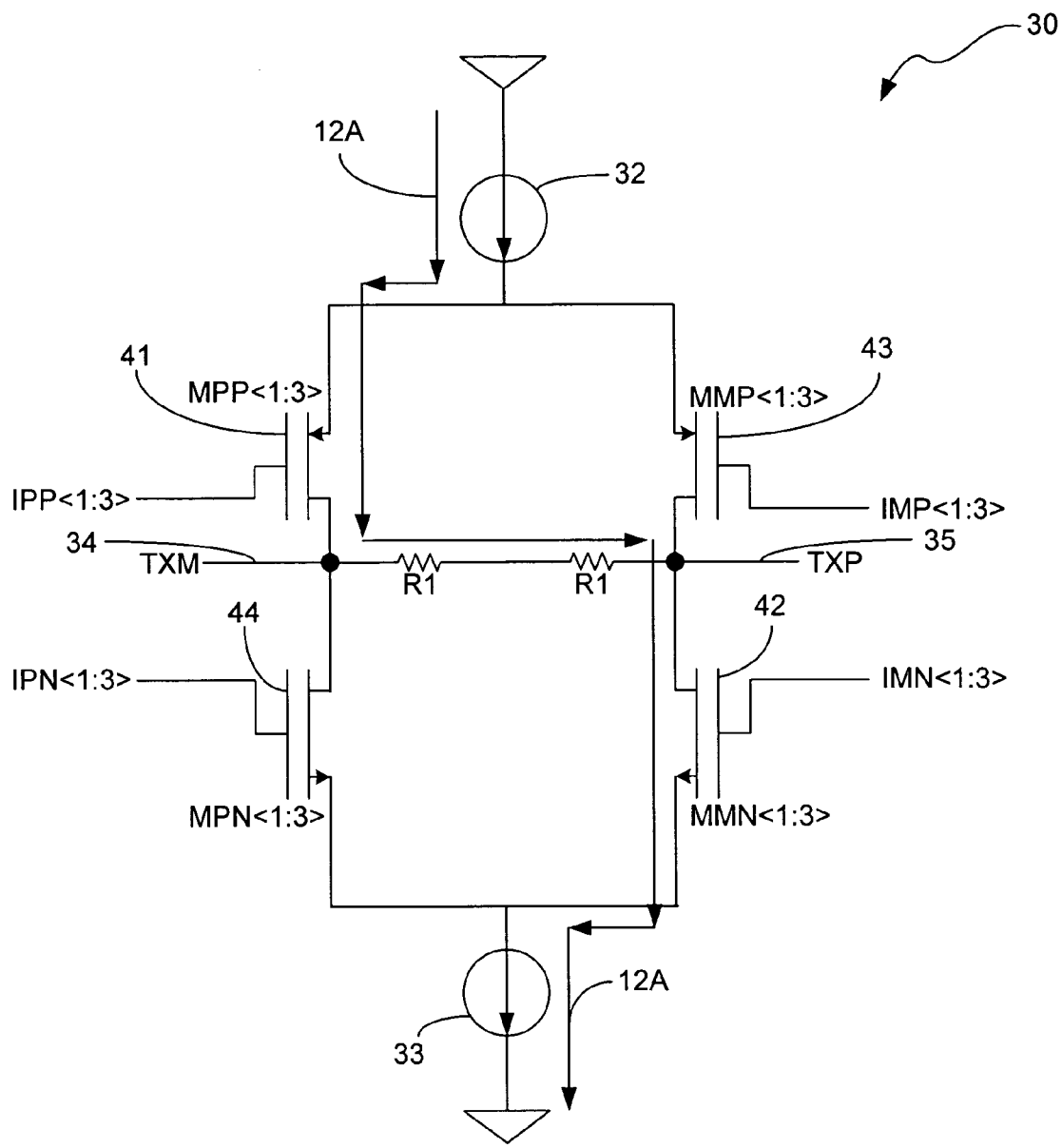
FIG. 3A illustrates a block diagram of a known line driver circuit being driven to produce an output signal that transitions from low to high.

Prior to describing the driver circuit and drive chain configurations of the invention, a typical H-bridge driver circuit and the manner in which it operates will be described with reference to FIGS. 3A and 3B. FIG. 3A is a block diagram of a known line driver circuit 30 that is configured to be driven by a known drive chain (not shown). The driver circuit 30 shown in FIG. 3A is a typical H-Bridge drive circuit.

Figure 1:
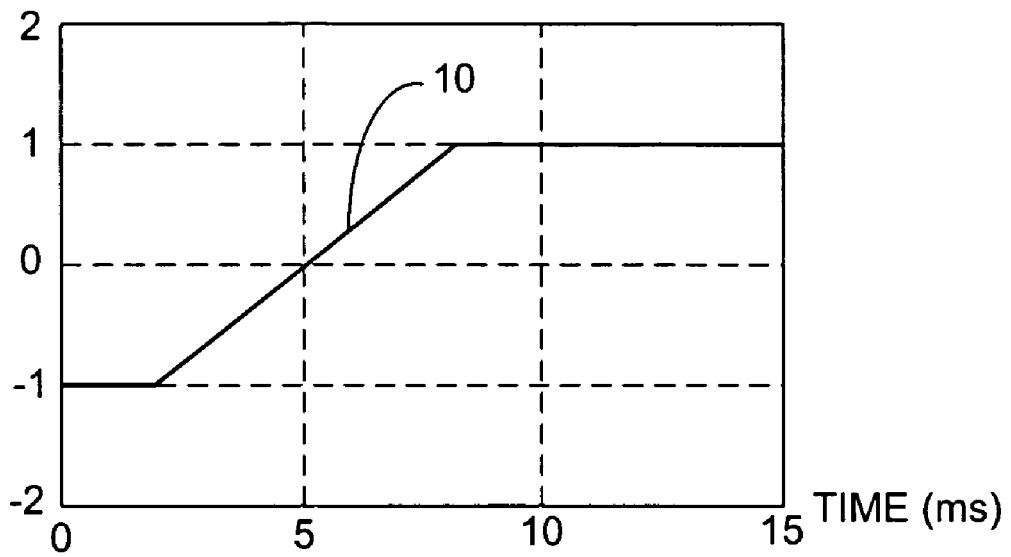
FIG. 1 illustrates a graph of driver output voltage as a function of time for an ideal case of a low to high transition.
Figure 2:
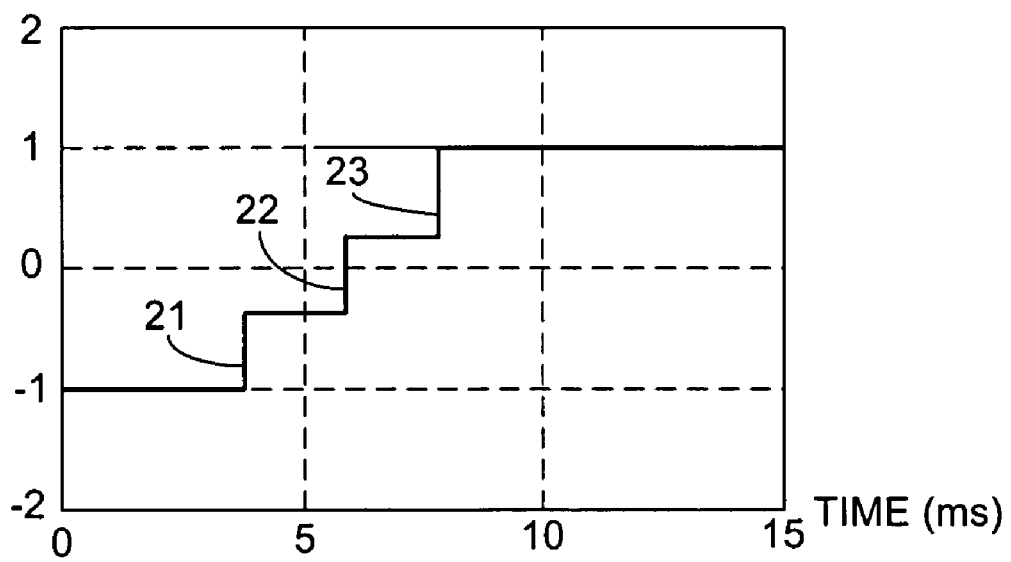
FIG. 2 illustrates a graph of driver output voltage as a function of time for a non-ideal case of a transition from low to high for a known driver circuit that employs 3-stage staggered switching.

The driver circuit 30 includes first and second current sources 32 and 33 that mirror each other and that cause an output voltage differential to be produced across output terminals TXM 34 and TXP 35 of the driver circuit 30. The current sources typically are Field Effect Transistors (FETs) fabricated in a Complementary Metal Oxide Semiconductor (CMOS) process. The driver circuit 30 has four output elements 41, 42, 43 and 44 that are switched in a particular manner to control the polarity of the signal output from the driver circuit 30 at output terminals 34 and 35. Each of the output elements 41–44 comprises three FET transistors that are connected in parallel and switched on in a staggered fashion to create a stepped low-to-high transition of the type represented by the graph shown in FIG. 2.

Output elements 41 and 43 are made up of PFETs and output elements 42 and 44 are made up of NFETs. Each of the output elements typically has multiple FETs and each FET constitutes a stage of the corresponding output element. Thus, an output element that has 3 PFETs is typically referred to as a 3-stage element. In order to simplify the drawings, each output element is represented by a single FET with bus notation rather than showing all of the physical connections.

In general, the driver circuit 30 operates as follows. When all of the transistors of output elements 41 and 42 are switched on and all of the transistors of output elements 43 and 44 are switched off, the driver current follows the path represented by arrow 12A. When this occurs, the differential voltage measured at the output terminals 34 and 35 swings from low to high, albeit in a stepped fashion due to the staggered switching of the FETs of each output element. The switching of the transistors of the output stages 41, 42, 43 and 44 is controlled by signals IPP<1:3>, IMN<1:3>, IMP<1:3>and IPN<1:3>, respectively.

Figure 3B:
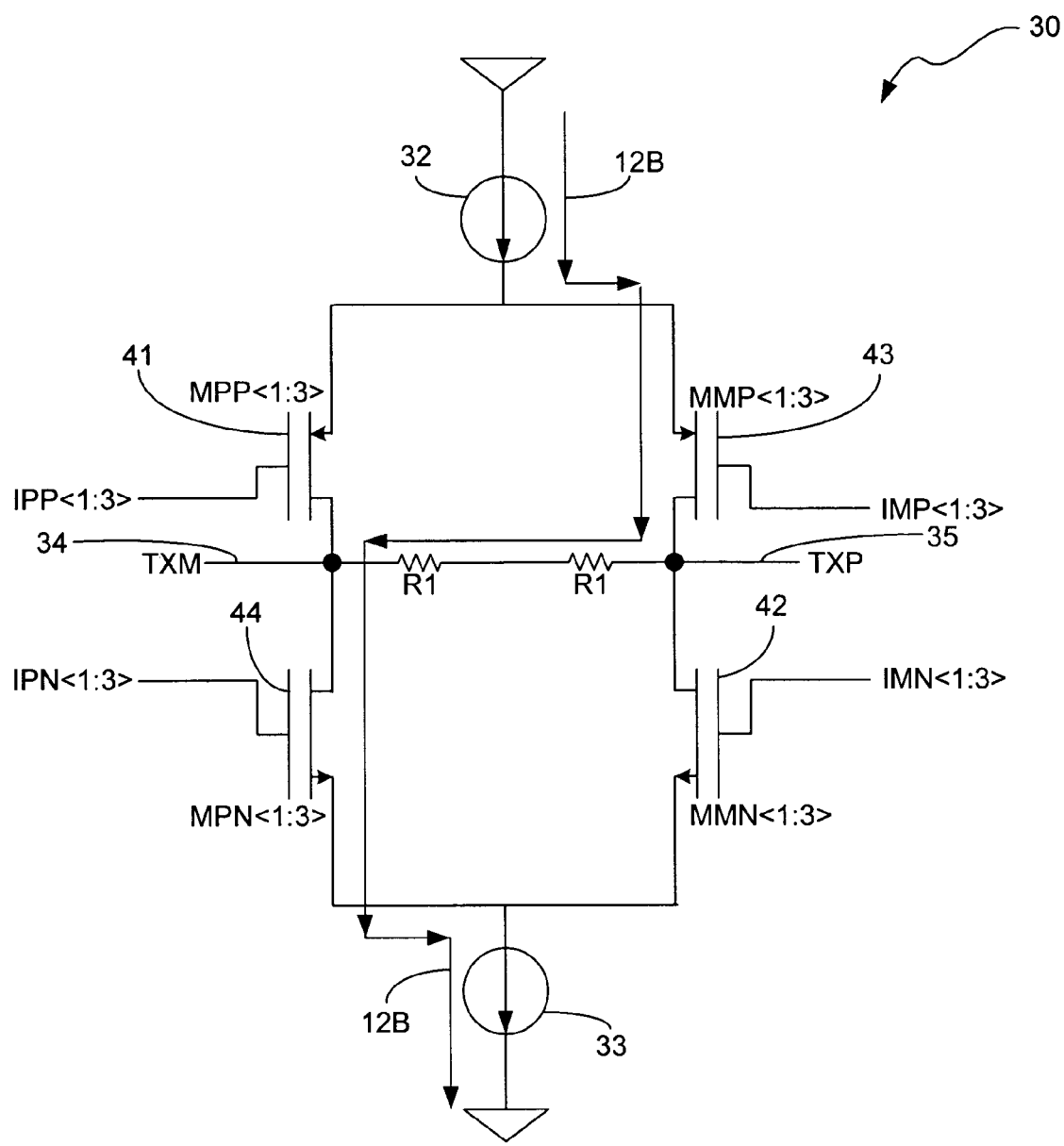
FIG. 3B illustrates a block diagram of a known line driver circuit being driven to produce an output signal that transitions from high to low.

FIG. 3B illustrates a block diagram of the driver circuit 30 shown in FIG. 3A, wherein all of the transistors of output elements 43 and 44 are switched on and all of the transistors of output elements 41 and 42 are switched off. In this state, the driver current follows the path represented by arrow 12B. When this occurs, the differential voltage measured at the output terminals 34 and 35 swings from high to low. As in the case shown in FIG. 3A, the transition from high to low is stepped due to the staggered switching of the FETs of each output element.

Figure 4:
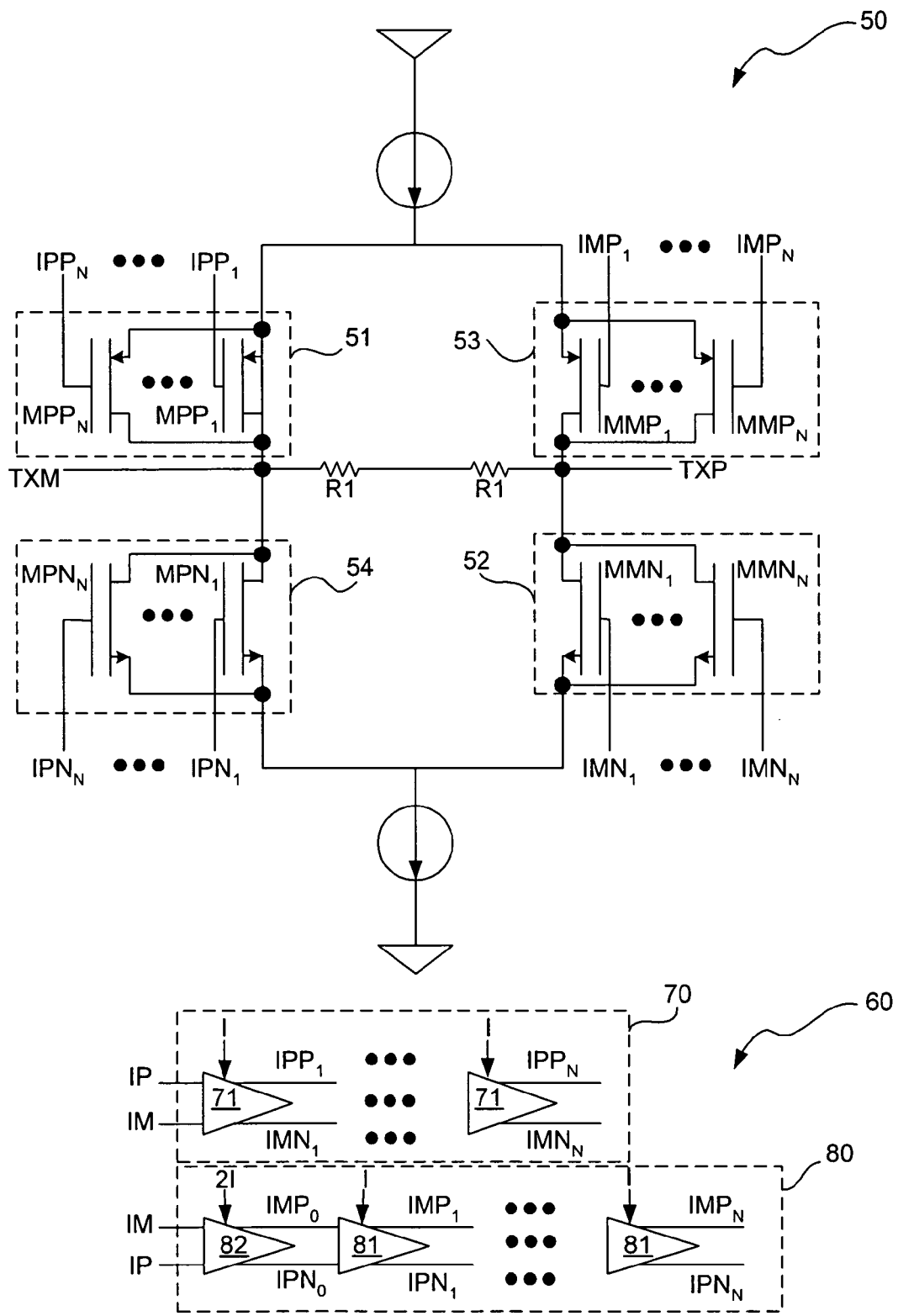
FIG. 4 illustrates a block diagram of the driver circuit of the invention driven by the drive chain configuration of the invention in accordance with one exemplary embodiment.

Having described a known driver circuit and the manner in which it operates, the driver circuit and drive chain configuration of the invention will now be described with reference to exemplary embodiments. FIG. 4 illustrates a block diagram of the driver circuit 50 and drive chain configuration 60 of the invention in accordance with an embodiment. The driver circuit 50 comprises four output elements 51, 52, 53 and 54. Output elements 51 and 53 each comprise N PFETs, where N is a positive integer having a value equal to or greater than 1. Output elements 52 and 54 each comprise N NFETs. The output elements 51–54 are driven by the drive chain configuration 60, which preferably comprises a first drive chain 70 made up of N delay elements 71 and a second drive chain 80 made of N delay elements 81 and an additional delay element 82.

In accordance with this embodiment, the first drive chain 70 controls the switching of output elements 51 and 52 of the drive circuit 50 and the second drive chain 80 controls the switching of output elements 53 and 54. In accordance with this embodiment, the delay elements 71, 81 and 82 are current-starved inverters that are current controlled, and each produces a time delay that has a duration that is inversely proportional to the magnitude of the current signal that controls the delay element. The delay element circuitry in accordance with an exemplary embodiment is described below in detail with reference to FIG. 6.

With reference again to FIG. 4, all of the delay elements 71 and 81 produce generally the same time delay, $t_{DELAY}$, with respect to signals IP and IM. However, the first delay element 82 in the second drive chain 80 produces a time delay $\frac{1}{2}(t_{DELAY})$ with respect to signals IP and IM, which is half the duration of the time delay produced by the other delay elements 71 and 81. The effect of the additional delay element 82 that produces half of the time delay produced by the delay elements 71 and 81 will now be described with reference to FIG. 4.

For every bit transition from low to high, the N PFETs that make up element 51 and the N NFETs that make up element 52 are turned on in a staggered fashion by the outputs of successive ones of the delay elements 71 of drive chain 70. In other words, a first one of the PFETs, denoted $MPP_1$, of output element 51 and a first one of the NFETs, denoted $MMN_1$, of delay element 52 are turned on simultaneously by signals $IPP_1$, and $IMN_N$, respectively. Signals $IPP_1$, and $IMN_1$ are the outputs of the first delay element of the first drive chain 70, which produces a time delay $t_{DELAY}$ with respect to signals IP and IM. Signals $IMN_1$–$IMN_N$ are the inverse of signals $IPP_1$–$IPP_N$.

After a time delay equal to $t_{DELAY}$ produced by the first delay element of the first drive chain 70, a second one (not shown) of the PFETs of output element 51 and a second one (not shown) of the NFETs of output element 52 are turned on simultaneously by signals $IPP_2$ and $IMN_2$ (not shown), respectively, which are the outputs of the second delay element of drive chain 70. Then, after a second time delay $t_{DELAY}$ produced by the second delay element of drive chain 70, a third one (not shown) of the PFETs of output element 51 and a third one of the NFETs of output element 52 are turned on simultaneously by signals $IPP_3$ and $IMN_3$ (not shown), respectively, which are the outputs of a third one (not shown) of the delay elements of drive chain 70. After a total aggregate time delay of $(N \times t_{DELAY})$ with respect to signals IP and IM, the Nth PFET, denoted $MPP_N$, of output element 51 and the Nth NFET, denoted $MMN_N$, of output element 52 are turned on simultaneously by signals $IPP_N$ and $IMN_N$ output from a last one of the delay elements 71 of drive chain 70.

While output elements 51 and 52 are turning on, output elements 53 and 54 are turning off, and vice versa. That is, for a bit transistion from low to high, while the individual stages of output elements 51 and 52 are sequentially turning on, the corresponding indivual stage counterparts of output elements 53 and 54 are turning off, although delayed by $\frac{1}{2}(t_{DELAY})$. For every bit transition from high to low, the N PFETs that make up output element 53 and the N NFETs that make up element 54 are turned on in a staggered fashion by the outputs of the delay elements 81 of the second drive chain 80. However, as stated above, the drive chain 80 that drives output elements 53 and 54 has the additional delay element 82 that produces a time delay that is one half that produced by the other delay elements, i.e., a time delay equal to $\frac{1}{2}(t_{DELAY})$.

The FETs of the output elements 53 and 54 turn on and off in the same manner in which the elements 51 and 52 turn on and off, with the exception that the delay element 82 causes the signals $IMP_1$, and $IPN_1$ that control the switching of the first PFET ($MMP_1$) of output element 53 and the first NFET ($MPN_1$) of output element 54 to be delayed by an additional amount equal to $\frac{1}{2}(t_{DELAY})$ compared to the amount by which signals $IPP_1$ and $IMN_1$ are delayed by the first delay element 71 of the first drive chain 70. This additional time delay of $\frac{1}{2}(t_{DELAY})$ is propagated through all of the delay elements 81 of the second drive chain 80 and results in a smoothing out of the steps in the transition regions where the drive circuit output signal transitions from high to low and from low to high. This smoothing is described in more detail below with reference to the graph shown in FIG. 7.

For a high-to-low bit transition, the driver circuit 50 operates in essentially the same manner as that described above for a low-to-high bit transition, except that for a high-to-low transition, the PFETs, denoted $MMP_1$–$MMP_N$, of output element 53 and the NFETs, denoted $MPN_1$–$MPN_N$, of delay element 54 are turned on in a staggered fashion by the signals $IMP_0$–$IMP_N$ and $IPN_0$–$IPN_N$, respectively. The second drive chain produces a total aggregate time delay equal to $((N \times t_{DELAY}) + \frac{1}{2}(t_{DELAY}))$. While output elements 53 and 54 are turning on, output elements 51 and 52 are turning off, and vice versa.

Figure 5:
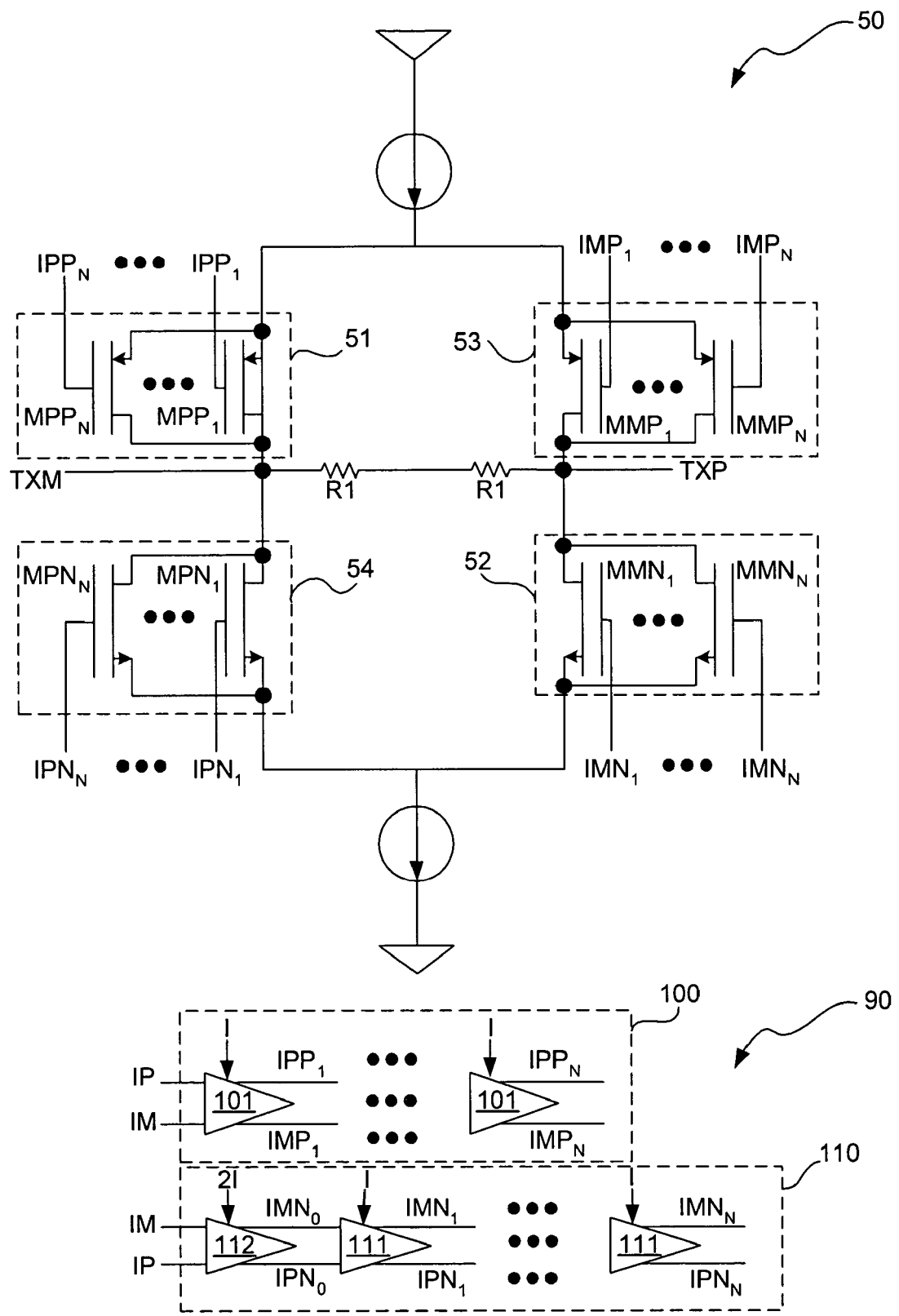
FIG. 5 illustrates a block diagram of the driver circuit of the invention driven by the drive chain configuration of the invention in accordance with another exemplary embodiment.

FIG. 5 illustrates a block diagram of the driver circuit and drive chain configuration of the invention in accordance with another embodiment. The driver circuit 50 shown in FIG. 5 is identical to the driver circuit 50 shown in FIG. 4. The drive chain configuration 90 shown in FIG. 5 is very similar to the drive chain configuration 60 shown in FIG. 4. However, the outputs of the delay elements 101 of the first drive chain 100 of the drive chain configuration 90 shown in FIG. 5 drive output elements 51 and 53, instead of output elements 51 and 52 (FIG. 4). Similarly, the outputs of the delay elements 111 of the second drive chain 110 of the drive chain configuration 90 shown in FIG. 5 drive output elements 52 and 54, instead of output elements 53 and 54 (FIG. 4).

Each of the delay elements 101 and 111 of the first and second drive chains 100 and 110, respectively, produces a time delay equal to $t_{DELAY}$. Delay element 112 of the second drive chain produces a time delay equal to $\frac{1}{2}(t_{DELAY})$. The driver circuit 50 is driven by the drive chain configuration 90 shown in FIG. 5 in the same manner in which it is driven by the drive chain configuration 60 shown in FIG. 4. The output signals generated by the drive chain configuration 90 cause output elements 51 and 52 to be switched on as output elements 53 and 54 are switched off, and vice versa.

Figure 6:
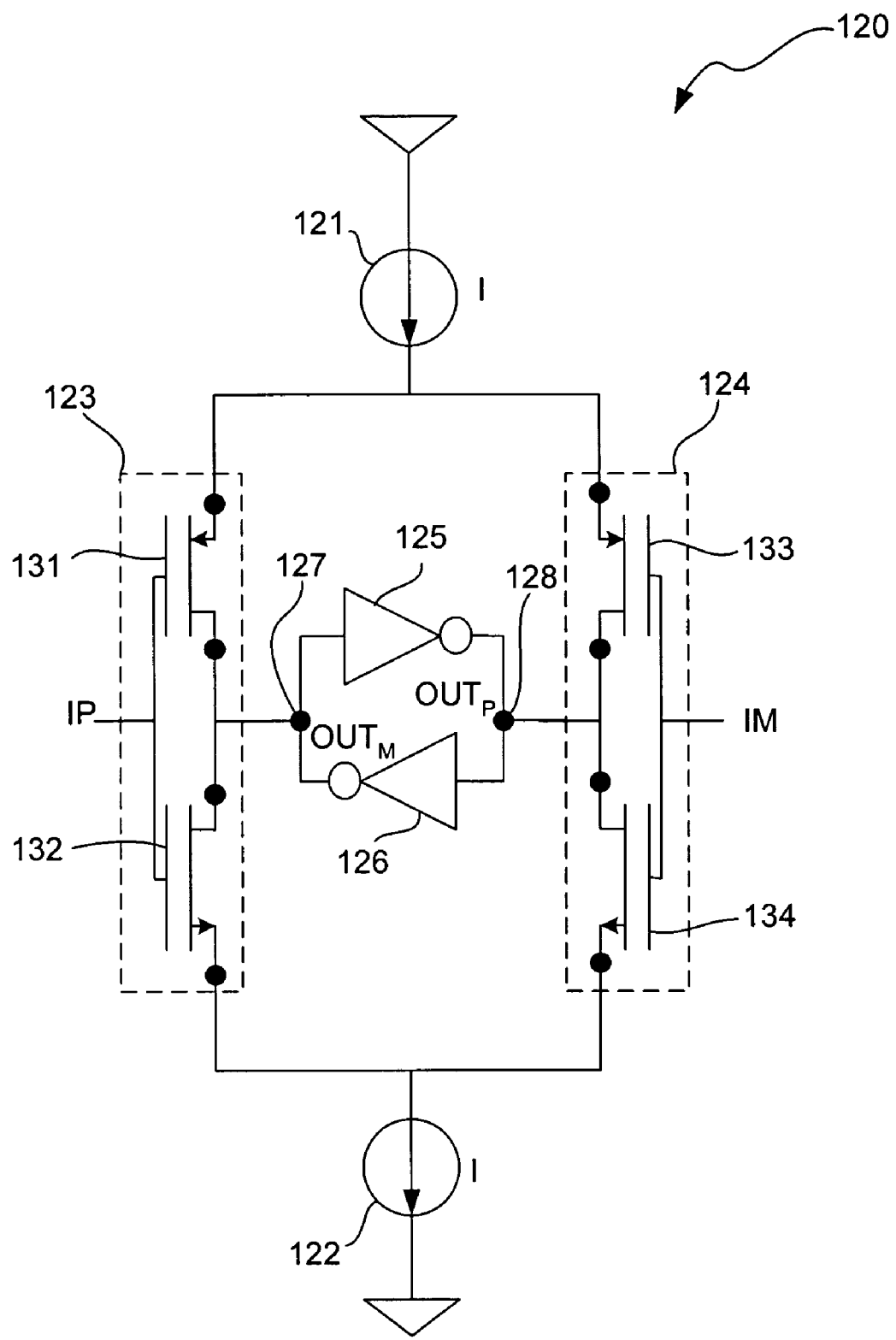
FIG. 6 illustrates a schematic diagram of a delay element of the drive chain configurations shown in FIGS. 4 and 5 in accordance with an exemplary embodiment.

FIG. 6 illustrates a schematic diagram of a delay element 120 that is suitable for use in the drive chain configurations 60 and 90 shown in FIGS. 4 and 5, respectively. The delay element 120 has two current sources 121 and 122, which are typically FETs. The delay element 120 has a first input gate 123 and a second input gate 124. The first input gate 123 receives the input signal IP and the second input gate 124 receives the input signal IM. When input signal IP is low, input signal IM is high, and vice versa. The delay element 120 has first and second inverters 125 and 126, respectively. The output of the first inverter 125 is tied to the input of the second inverter and the input of the first inverter 125 is tied to the output of the second inverter 126. The delay element 120 has a first output node 127, denoted $OUT_M$, and a second output node 128, denoted $OUT_P$.

The first input gate 123 has a PFET 131 and an NFET 132. The drain of PFET 131 is connected to the drain of NFET 132. The gates of PFET 131 and of NFET 132 receive the input signal IP. The second input gate 124 has a PFET 133 and an NFET 134. The drain of PFET 133 is connected to the drain of NFET 134. The gates of PFET 133 and of NFET 134 receive the input signal IM.

The circuit 120 operates as follows. When input signal IP is low and input signal IM is high, PFET 131 and NFET 134 are turned on and NFET 132 and PFET 133 are turned off. In this state, the current follows a path from current source 121 through PFET 131, and charges node $OUT_M$ high. When current flows in this direction, output node $OUT_P$ is low.

When input signal IP is high and input signal IM is low, PFET 131 and NFET 134 are turned off and NFET 132 and PFET 133 are turned on. In this state, the current follows a path from current source 121 through PFET 133, and charges node $OUT_P$ high. When current flows in this direction, output node $OUT_M$ is low.

The time delay between the instant in time when the input signal IP goes low and the instant in time when the output node $OUT_M$ goes high in response is inversely proportional to the magnitude of the current. The FETs used in the delay element 120 are sized such that, when the current generated by current source 121 is equal to I, the time delay is equal to $t_{DELAY}$, and such that when the current generated by the current source 121 is equal to 2I, the time delay is equal to $\frac{1}{2}(t_{DELAY})$.

Figure 7:
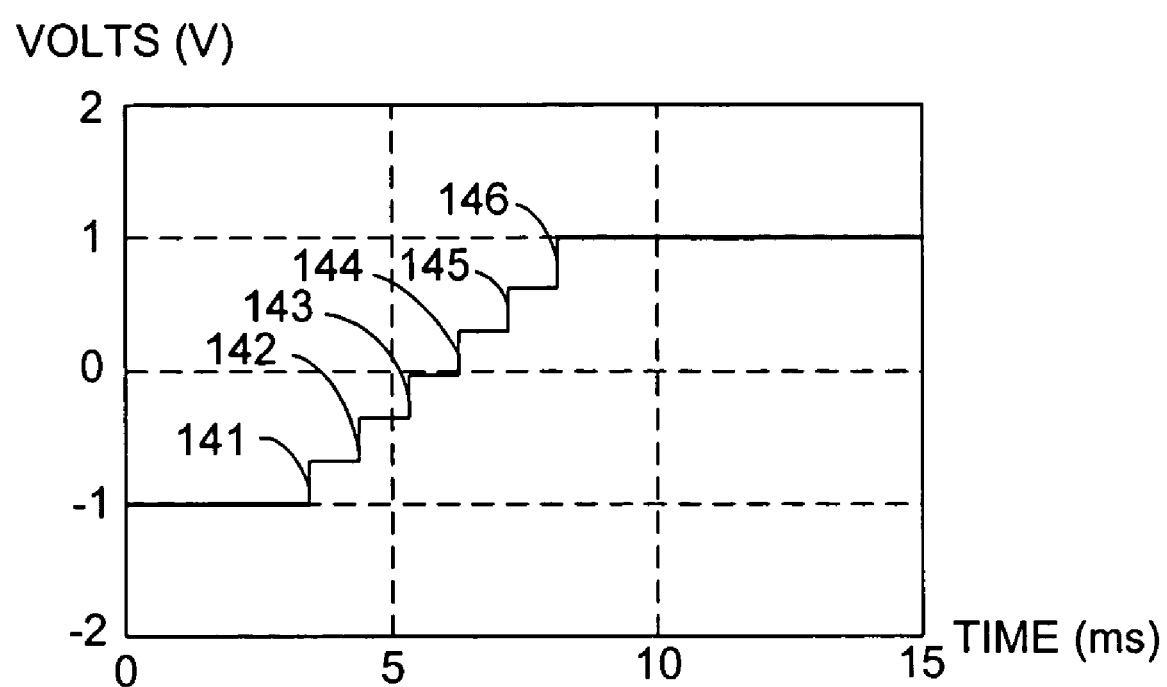
FIG. 7 illustrates a graph of driver output voltage as a function of time for a low-to-high transition for the driver circuit and drive chain configuration of the type illustrated in FIGS. 4 and 5.

FIG. 7 illustrates a graph having a plot of driver output voltage as a function of time for a low-to-high transition for a driver circuit of the present invention of the type shown in FIGS. 4 and 5 when 3-stage (i.e., N=3) staggered switching is employed and the drive circuit is driven by either of the drive chain configurations illustrated in FIGS. 4 and 5. For the prior art driver circuit configuration of the type shown in FIGS. 3A and 3B, when 3-stage staggered switching is employed, the low-to-high transition has three steps 21, 22 and 23 in FIG. 2 as compared to the six steps 141, 142, 143, 144, 145 and 146. In addition, the steps 141–146 are smaller in magnitude than steps 21–23. Thus, it can be seen that the driver circuit and drive chain configuration of the invention produce a smoother transition than that produced by the known driver circuit and drive chain configuration. Also, the drive chain of the invention does not introduce additional common mode noise during switching.

In addition, the drive chain configurations of the invention enable the complexity of the driver circuit to be reduced. As stated above, in order to enable a known driver circuit (e.g., FIGS. 3A and 3B) that uses the typical drive chain configuration (not shown) to produce the output signal plotted on the graph shown in FIG. 7, each output element of the driver circuit would need to have six FETs. With the known driver circuit and drive chain configuration, 2N delay elements are needed for the drive chain, where N equals the number of FETs in each of the output elements of the driver circuit. Therefore, with the known driver circuit and drive chain configuration, in order to obtain an output signal such as that shown in FIG. 7, N=6 FETs are required in each output element, and therefore 2N=12 delay elements are needed in the drive chain.

In contrast, in accordance with the invention, the output signal shown in FIG. 7 is obtained using three FETs in each output stage. Therefore, in accordance with the invention, in order to produce a signal such as that shown in FIG. 7, which has six steps, N=3 FETs are used in each output element and the number of delay elements that is required is 2N+1, or 7. With reference to FIG. 5, the first drive chain 100 of the drive chain configuration 90 would have N=3 delay elements, each of which produces a time delay equal to $t_{DELAY}$. The second drive chain 110 would have N+1=4 delay elements, N of which each produce a time delay equal to $t_{DELAY}$ and a first one of which produces a time delay equal to $\frac{1}{2}(t_{DELAY})$. Consequently, the invention greatly reduces the complexity of the driver circuit and associated drive chain configuration, which reduces the amount of area needed on an IC in which the driver circuit and drive chain are implemented. The reduction in complexity also results in reduced power consumption.

It should be noted that the invention is not limited with respect to the number of output stages that are in the driver circuit or with respect to the number of delay elements that are in the drive chain. Also, although an H-bridge driver circuit has been used herein to describe the principles and concepts of the invention, the driver chain of the invention may be used with any type of driver circuit. Also, the invention is not limited with respect to the timing delay provided by any of the delay elements.

The FETs of the output elements are typically much larger than the FETs of the delay elements. In order to drive the large FETs of the output elements, typically a buffer (not shown) is located between the output of the delay element of the drive chain configuration and the gate of the FET of the output element that is being driven. The buffer improves the strength of the signal output from the delay element and obviates the need to use large FETs in the delay element to obtain sufficient signal strength to drive the FETs of the output elements.

Figure 8:
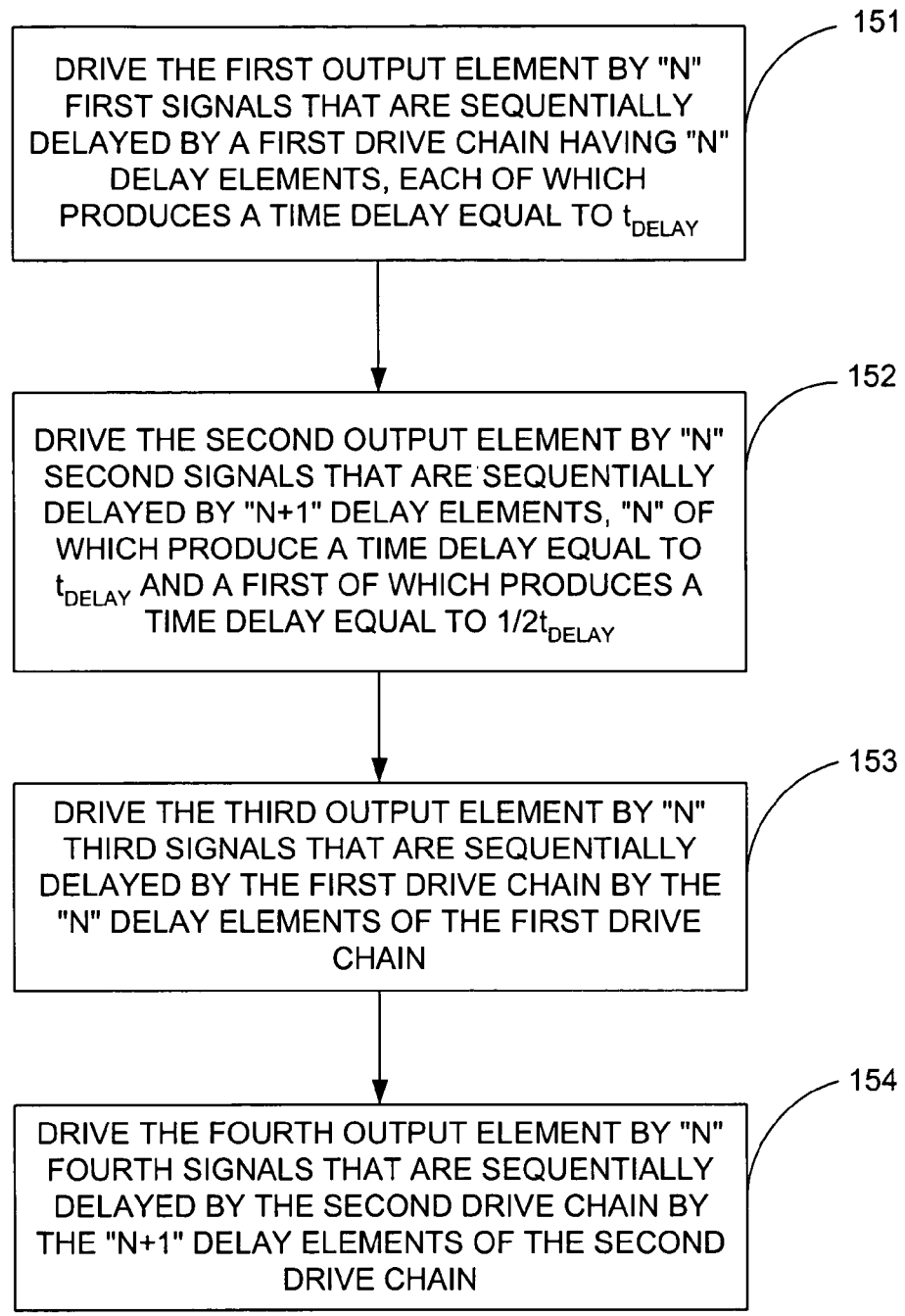
FIG. 8 illustrates a flow chart that represents the method of the invention in accordance with an exemplary embodiment for driving a driver circuit with a drive chain configuration of the type illustrated in FIGS. 4 and 5.

FIG. 8 illustrates a flow chart that represents the method of the invention in accordance with another exemplary embodiment wherein the driver circuit is an H-bridge driver circuit of the type shown in FIGS. 4 and 5. As indicated by block 151, a first output element of a driver circuit is driven by "N" signals that are sequentially delayed by a first drive chain comprising N delay elements, each of which produces a time delay equal to $t_{DELAY}$. Therefore, the total time delay generated by the first drive chain is equal to $(N \times t_{DELAY})$. As indicated by block 152, a second output element of the driver circuit is driven by "N" signals that are sequentially delayed by a second drive chain comprising N+1 delay elements, N of which produce a time delay equal to $t_{DELAY}$ and one of which produces a time delay equal to $\frac{1}{2}(t_{DELAY})$. Therefore, the total time delay produced by the second drive chain is equal to $((N \times t_{DELAY})+(\frac{1}{2}t_{DELAY}))$. As indicated by block 153, a third output element of the driver circuit is driven by "N" signals that are delayed by the first drive chain by a total amount equal to $(N \times t_{DELAY})$. As indicated by block 154, a fourth output element of the driver circuit is driven by "N" signals that are delayed by the second drive chain by a total amount equal to $((N \times t_{DELAY})+(\frac{1}{2}t_{DELAY}))$.

It should be noted that the present invention has been described with reference to particular exemplary embodiments in order to demonstrate some of the principles and advantages of the present invention. The present invention is not limited to these embodiments. Variations and modifications can be made to the embodiments described herein without deviating from the principles and concepts of the invention, and all such modifications and variations are within the scope of the present invention.

What is claimed is:

1. A driver circuit comprising:
   a first output element comprising at least N transistors connected in parallel;
   a second output element comprising at least N transistors connected in parallel;
   a third output element coupled to the first output element and comprising at least N transistors connected in parallel;
   a fourth output element coupled to the second output element and comprising at least N transistors connected in parallel;
   a first drive chain coupled to the first and second output elements and configured to generate output signals for controlling switching of the transistors of the first and second output elements, the first drive chain comprising N delay elements, the delay elements of the first drive chain being cascaded to form a series of delay elements, each of the delay elements producing a time delay equal to $t_{DELAY}$, the entire cascaded series of delay elements of the first drive chain producing an aggregate time delay equal to at least $(N \times t_{DELAY})$;
   a second drive chain coupled to the third and fourth output elements and configured to generate output signals for controlling switching of the transistors of the third and fourth output elements, the second drive chain comprising N+1 delay elements cascaded to form a series of delay elements, N of the delay elements of the second drive chain each producing a time delay equal to $t_{DELAY}$ and a first one of the delay elements of the second drive chain producing a time delay equal to $\frac{1}{2}(t_{DELAY})$, the entire cascaded series of delay elements of the second drive chain producing an aggregate time delay equal to at least $((N \times t_{DELAY})+(\frac{1}{2}t_{DELAY}))$, and
   a pair of output terminals coupled between the first, second, third and fourth output elements and configured in such a way that a voltage differential is produced between the pair of output terminals,
   wherein the first drive chain controls the switching of the transistors of the first and second output elements and the second drive chain controls the switching of the transistors of the third and fourth output elements in such a way that the voltage differential between the pair of output terminals transitions from a first state to a second state in a plurality of transition steps,
   wherein the time delay produced by the first one of the delay elements of the second drive chain causes smoothing of the plurality of transition steps during the transition from the first state to the second state.

2. The driver circuit of claim 1, wherein the driver circuit is an H-bridge driver circuit.

3. The driver circuit of claim 1, wherein the transistors are field effect transistors (FETs).

4. A method of driving output stages of a driver circuit comprising:
   driving a first output element and a second output element of the driver circuit with a first signal generated by a first drive chain comprising N delay elements cascaded in series, each delay element of the first drive chain producing a time delay equal to $t_{DELAY}$, the cascaded series of delay elements of the first drive chain produces an aggregate time delay equal to at least $(N \times t_{DELAY})$; and driving a third output element and a fourth output element of the driver circuit with a second signal generated by a second drive chain, the second drive chain comprising N+1 delay elements connected in series, N of the delay elements of the second drive chain producing a time delay equal to $t_{DELAY}$, and one of the delay elements of the second drive chain producing a time delay equal to $\frac{1}{2}(t_{DELAY})$, the cascaded series of delay elements of the second drive chain producing an aggregate time delay equal to at least $((N \times t_{DELAY}) + (\frac{1}{2}t_{DELAY}))$, wherein the first and second output element driving step controls the switching of the first and second output elements and the third and fourth output element driving step controls the switching of the third and fourth output elements in such a way that a voltage differential between a pair of output terminals coupled between the first, second, third and fourth output elements transitions from a first state to a second state in a plurality of transitions steps, and wherein the time delay produced by the first one of the delay elements of the second drive chain causes smoothing of the plurality of transition steps during the transition from the first state to the second state.

5. The method of claim 4, wherein the driver circuit is an H-bridge driver circuit.

6. The method of claim 4, wherein the transistors are field effect transistors (FETs).

7. A driver circuit comprising:
a first output element comprising at least N transistors connected in parallel, N being a positive integer having a value equal to or greater than 1;
a second output element comprising at least N transistors connected in parallel;
a third output element coupled to the first output element and comprising at least N transistors connected in parallel;
a fourth output element coupled to the second output element and comprising at least N transistors connected in parallel;
a first drive chain coupled to the first and second output elements and configured to receive a set of input signals comprising first and second input signals and to delay the first and second input signals to produce a plurality of sets of delayed control signals that control switching of respective transistors of the first and second output elements, the first drive chain comprising N delay elements cascaded in series, each of the delay elements producing a time delay equal to $t_{DELAY}$, each delay element outputting a respective one of the sets of delayed control signals delayed by an amount dependent on an order in which the respective delay element occurs in the cascaded series of the delay elements of the first drive chain, the first drive chain producing a total time delay equal to $(N \times t_{DELAY})$;
a second drive chain coupled to the third and fourth output elements and configured to receive said set of input signals comprising said first and second input signals and to delay the first and second signals to produce a plurality of sets of delayed control signals that control switching of respective transistors of the third and fourth output elements, the second drive chain comprising N+1 delay elements cascaded in series, a first delay element of the second drive chain producing a time delay equal to $\frac{1}{2}(t_{DELAY})$ and N delay elements of the second drive chain not including said first delay element of the second drive chain each producing a time delay equal to $t_{DELAY}$, the second drive chain producing a total time delay equal to $(N \times t_{DELAY} + \frac{1}{2}t_{DELAY})$, said N delay elements of the second drive chain each outputting a respective one of the sets of delayed control signals that control switching of respective transistors of the third and fourth output elements, each of the N delay elements of the second drive chain delaying the set of signals output therefrom by an amount dependent on an order in which the respective delay element occurs on the cascaded series of delay elements of the second drive chain, and a pair of output terminals coupled between the first, second, third and fourth output elements and configured in such a way that a voltage differential is produced between the pair of output terminals, wherein the first drive chain controls the switching of the transistors of the first and second output elements and the second drive chain controls the switching of the transistors of the third and fourth output elements in such a way that the voltage differential between the pair of output terminals transitions from a first state to a second state in a plurality of transition steps, wherein the time delay produced by the first one of the delay elements of the second drive chain causes smoothing of the plurality of transition steps during the transition from the first state to the second state.

8. The driver circuit of claim 7, wherein the driver circuit is an H-bridge driver circuit.

9. The driver circuit of claim 7, wherein the transistors of the first output element are P field effect transistors (PFETs) and the transistors of the second output element are N field effect transistors (NFETs), and wherein each set of delayed control signals produced by the first drive chain comprises a first signal that switches a respective one of the PFETs of the first output element and a second signal that switches a respective one of the NFETs of the second output element.

10. The driver circuit of claim 9, wherein the transistors of the third output element are PFETs and the transistors of the fourth output element are NFETs, and wherein each set of delayed control signals produced by the second drive chain comprises a first signal that switches a respective one of the PFETs of the third output element and a second signal that switches a respective one of the NFETs of the fourth output element.

11. The driver circuit of claim 9, wherein the transistors of the first output element are P field effect transistors (PFETs) and the transistors of the second output element are PFETs, and wherein each set of delayed control signals produced by the first drive chain comprises a first signal that switches a respective one of the PFETs of the first output element and a second signal that switches a respective one of the PFETs of the second output element.

12. The driver circuit of claim 11, wherein the transistors of the third output element are N field effect transistors (NFETs) and the transistors of the fourth output element are NFETs, and wherein each set of delayed control signals produced by the second drive chain comprises a first signal that switches a respective one of the NFETs of the third output element and a second signal that switches a respective one of the NFETs of the fourth output element.

* * * * *